(12) United States Patent
Tsai

(10) Patent No.: US 6,943,386 B2
(45) Date of Patent: Sep. 13, 2005

(54) PSEUDOMORPHIC HIGH ELECTRON MOBILITY FIELD EFFECT TRANSISTOR WITH HIGH DEVICE LINEARITY

(75) Inventor: Jung-Hui Tsai, Kaohsiung (TW)

(73) Assignee: National Kaohsiung Normal University, Kaohsiung (TW)

(*) Notice: Subject to any disclaimer, the term of this patent is extended or adjusted under 35 U.S.C. 154(b) by 162 days.

(21) Appl. No.: 10/667,589

(22) Filed: Sep. 23, 2003

(65) Prior Publication Data

US 2004/0262626 A1 Dec. 30, 2004

(51) Int. Cl.[7] .......................................... H01L 31/0328
(52) U.S. Cl. ....................... 257/190; 257/191; 257/192; 257/194; 257/280; 257/284; 257/E29.041
(58) Field of Search ................. 257/260–261, 257/279–284, 190–194

(56) References Cited

U.S. PATENT DOCUMENTS

2003/0017683 A1 * 1/2003 Emrick et al. .............. 438/478
2004/0119090 A1 * 6/2004 Chiu et al. .................. 257/194
2004/0155261 A1 * 8/2004 Anda et al. ................. 257/194
2004/0157353 A1 * 8/2004 Ouyang et al. ............... 438/38

* cited by examiner

Primary Examiner—George Fourson
Assistant Examiner—Thanh V. Pham
(74) Attorney, Agent, or Firm—Bacon & Thomas

(57) ABSTRACT

New pseudomorphic high electron mobility transistors (pHEMT's) with extremely high device linearity having an $n^+/p^+/n$ camel-gate heterostructure and $\delta$-doped sheet structure is disclosed. For the example of InGaP/InGaAs/GaAs $\delta$-doped pHEMT's with an $n^+$-GaAs/$p^+$-InGaP/n-InGaP camel-gate structure, due to the p-n depletion from $p^+$-InGaP gate to channel region and the presence of large conduction band discontinuity ($\Delta E_c$) at InGaP/InGaAs heterostructure, the turn-on voltage of gate is larger than 1.7 V. Attributed to the applied gate voltage partly lying on the camel gate and influence of the carrier modulation, the change of total depletion thickness under gate bias is relatively small, and high drain current and linear transconductance can be achieved, simultaneously. The excellent device performances provide a promise for linear and large signal amplifiers and high-frequency circuit applications.

15 Claims, 14 Drawing Sheets

| 109 |
|---|
| 108 |
| 107 |
| 106 |
| 105 |
| 104 |
| 103 |
| 102 |
| 101 |

Fig. 1

| 109 |
|---|
| 108 |
| 107 |
| 106 |
| 105 |
| 104 |
| 103 |
| 111 |
| 110 |
| 102 |
| 101 |

Fig. 2

PSEUDOMORPHIC HIGH ELECTRON MOBILITY FIELD EFFECT TRANSISTOR WITH HIGH DEVICE LINEARITY

FIELD OF THE INVENTION

This invention is related to a pseudomorphic High Electron Mobility Transistors (pHEMT's), which has an $n^+/p^+/n$ heterostructure camel-gate and a δ-doped layer structure.

BACKGROUND OF THE INVENTION

Recently, devices made of compound semiconductor material for high-speed, microwave, and power circuit applications have attracted a great deal of attention and played an important role in electronic integrated circuit field. As far as Field Effect Transistor (FET) is concerned, in order to make the devices operate at high frequency, reducing the FET gate's length, raising the carrier mobility, and decreasing the transport time are necessary. All kinds of high-performance devices, such as Metal Semiconductor Field Effect Transistor (MESFET), High Electron Mobility Transistor (HEMT), Doped Channel Field Effect Transistor (DCFET), and δ-doped layer Field Effect Transistor (δ-doped FET), have been successfully developed and widely applied to digital and microwave circuits, which have brought a lot of benefit to the communication industries. For the example of HEMT, because of the low impurity scattering and the high mobility of the Two-Dimensional Electron Gas (2DEG), the mobility of HEMT is improved to make the transconductance so high that it is suitable for high-frequency circuit application. However, there is still an issue about parallel conduction under the positive gate bias in HEMT. As for DCFET, it exploits non-doped large-energy-gap material to make up the Schottky contact of the gate, so that it avoids the parallel conduction problem and has high linearity of output transconductance. Further, DCFET has advantages of high current density and large breakdown voltage of the gate for high-frequency power circuit application. In the structure of δ-doped FET, a δ-doping sheet makes the V-type potential well and quasi-two dimensional electron gas. Further, $V_{GS}$ has less influence on the depletion thickness such that the linearity of transconductance is improved. There are more advantages in δ-doped FET, such as high output current density, large breakdown voltage, controllable threshold voltage, high linearity of transconductance, and so on. However, as far as MESFET, DCFET, and δ-doped FET are concerned, the carriers in the channel are lack of capability of modulation, which causes a large saturation voltage of the drain-source junction and a small operating range of the devices, and thus they are still unsuitable for circuit application.

Remarkably, in the high-tech microwave area of wireless broadband communication, pHEMT has been extensively applied to high-frequency device technologies for advanced low-power PCS cellular phone and fixed-network. Including all kinds of microwave circuit applications from low-frequency 1.8–2.2 GHz (PCS), 2.2–2.4 GHz (3G wireless cell phone), mid-frequency 28–31 GHz (LMDS, VSAT, broadband satellite), to high-frequency 76–77 GHz (auto radar cruise control), all broadband communication devices will use pHEMT in their major components.

Formerly, in the $Al_xGa_{1-x}As/GaAs$ pHEMT material system, the mole ratio x of Al has to be greater than 0.2 so as to produce larger 2DEG. However, due to the technology of the high etching ratio of InGaP and GaAs recently, the reliability of the devices made of the aforementioned pHEMT is getting better. Further, InGaP/GaAs has a feature of larger ΔEv/ΔEg (about 0.6) to constrain the gate's leakage current resulting from the impact ionization. As a result, the InGaP/GaAs material system has been used popularly. As for InGaP/InGaAs pHEMT, its ΔEc is greater than that of InGaP/GaAs, so that InGaP/InGaAs can achieve excellent transistor's characteristics of larger 2DEG and better confinement effect of electron. There are generally two types of pHEMT's. (1) pHEMT of n-InGaP (or n-AlGaAs) gate, and (2) δ-doped pHEMT. In the case of the pHEMT of n-InGaP (or n-AlGaAs) gate, when the gate-source bias is positively high, the n-InGaP (or n-AlGaAs) gate results in the issue of the large energy-gap parallel conduction and the poor linearity of output transconductance, such that it is unsuitable for power circuit application. As to the δ-doped pHEMT, it inserts δ-doped carrier supplying layer into non-doped i-InGaP (or i-AlGaAs) layer to replace n-InGaP (or n-AlGaAs) gate. Because the gate metal is plated onto the large energy-gap i-InGaP, the breakdown voltage of the gate is raised.

SUMMARY OF INVENTION

This invention discloses a novel pseudomorphic High Electron Mobility Transistors (pHEMT's) comprising an $n^+/p^+/n$ heterostructure camel-gate and δ-doped layer structure. For the example of InGaP/InGaAs/GaAs δ-doped pHEMT's with an $n^+$-GaAs/$p^+$-InGaP/n-InGaP camel-gate structure, due to the p-n depletion between $p^+$-InGaP gate and channel region, and the large conduction band discontinuity (ΔEc) at the InGaP/InGaAs heterojunction, the turn-on threshold voltage of the gate can be up to 1.7 V. Attributed to the applied gate voltage partly lying on the camel gate and influence of the carrier modulation, the change of total depletion thickness under gate bias is relatively small, and high drain current and linear transconductance can be achieved, simultaneously. For a single δ-doped pHEMT, when the gate-source voltage ranges from −2 V to +1 V, the transconductance can reach over 80% of the maximum transconductance, where $f_t$ and $f_{max}$ are 18 GHz and 30 GHz, respectively. For a double δ-doped pHEMT, when the gate-source voltage ranges from −5 V to +1 V, the transconductance can reach over 80% of the maximum transconductance, where $f_t$ and $f_{max}$ are 20 GHz and 32 GHz, respectively.

The pHEMT device presented in the invention can improve the drawbacks of the conventional MESFET, DCFET, and δ-doped FET, because of the smaller saturation voltage of the drain-source junction. In addition, the proposed pHEMT device with the $n^+/p^+/n$ heterostructure camel-gate has broader operating range of the gate voltage and higher linearity of transconductance in comparison with the conventional HEMT. Therefore, the pHEMT of the present invention is very suitable for linear, large signal amplifier, and high frequency circuit applications.

BRIEF DESCRIPTION OF THE DRAWINGS

FIG. 1 shows a structure diagram of a single δ-doped pHEMT of the present invention.

FIG. 2 shows a structure diagram of a double δ-doped pHEMT of the present invention.

Figure 3:
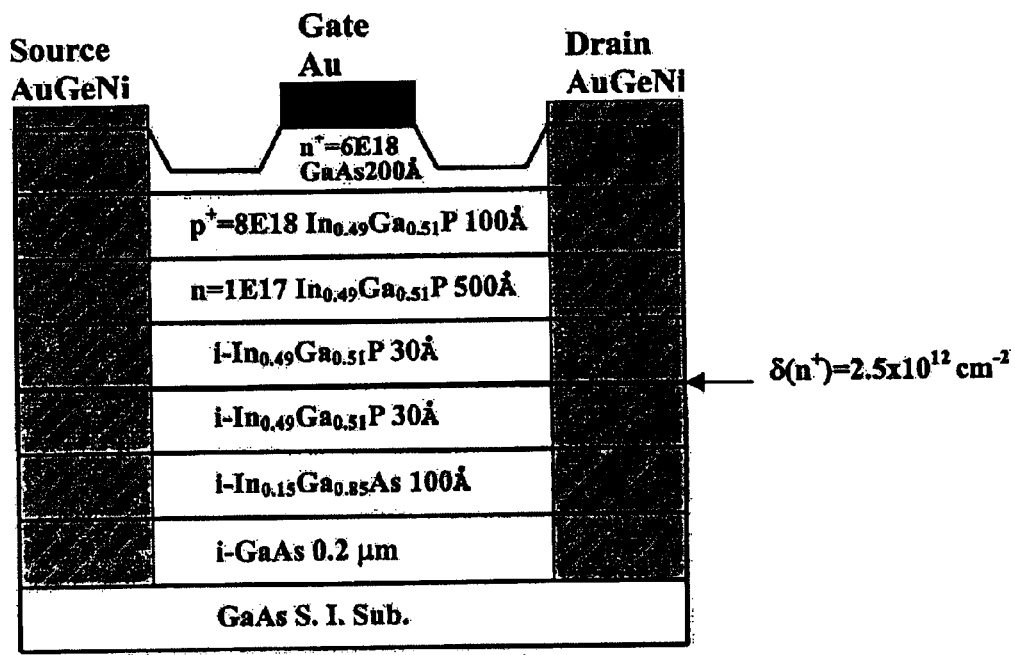
FIG. 3 shows a structure of pHEMT prepared in Example 1 of the present invention.

LEGENDS 101 semiconductor substrate
102 buffer layer
103 non-doped strain layer
104 first non-doped spacer layer
105 δ-doped carrier supplying layer
106 second non-doped spacer layer
107 n-doped semiconductor layer
108 p$^+$-doped semiconductor layer
109 n$^+$-doped semiconductor covering layer
110 additional δ-doped carrier supplying layer
111 additional non-doped spacer layer

DETAILED DESCRIPTION OF THE INVENTION

Figure 1:
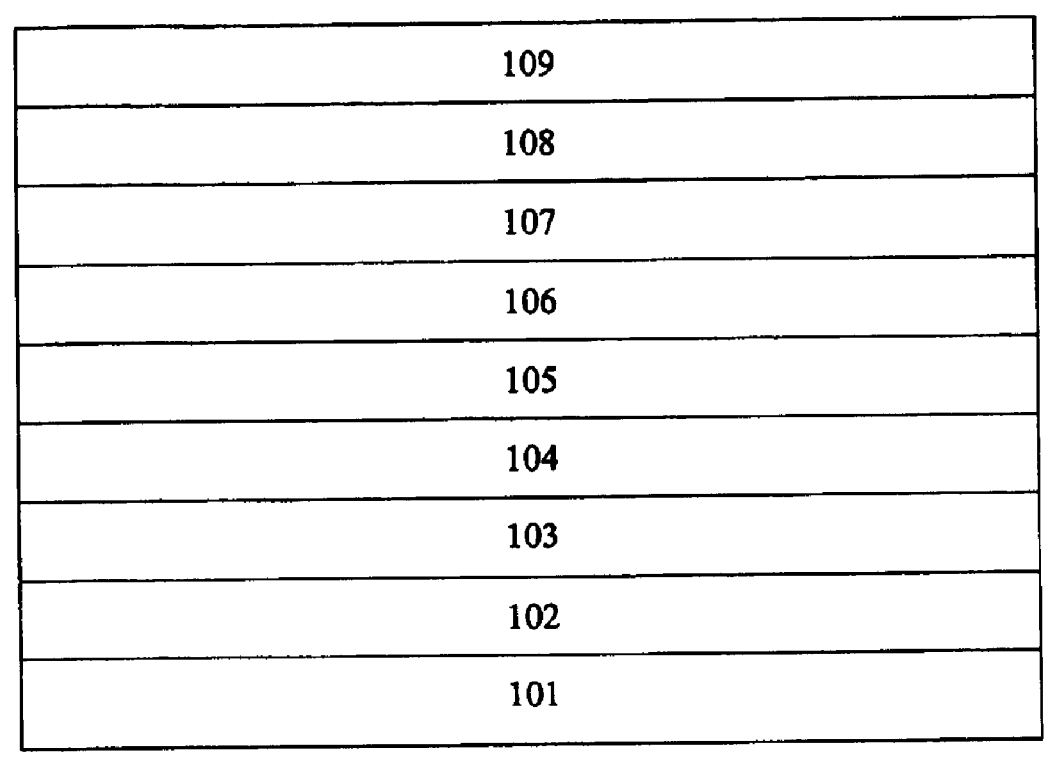

The structure of the pseudomorphic High Electron Mobility Transistor according to the first better practical implementation example of this invention is illustrated in FIG. 1. From bottom to top, the structure consists of one non-doped semiconductor material substrate 101 on the basis, one non-doped buffer layer 102, one non-doped strain layer 103, one first non-doped spacer layer 104, one δ-doped carrier supplying layer 105, one second non-doped spacer layer 106, one n-doped semiconductor layer 107, one p$^+$-doped semiconductor layer 108, and one n$^+$-doped semiconductor covering layer. This pHEMT has an n$^+$/p$^+$/n heterostructure gate.

Figure 2:
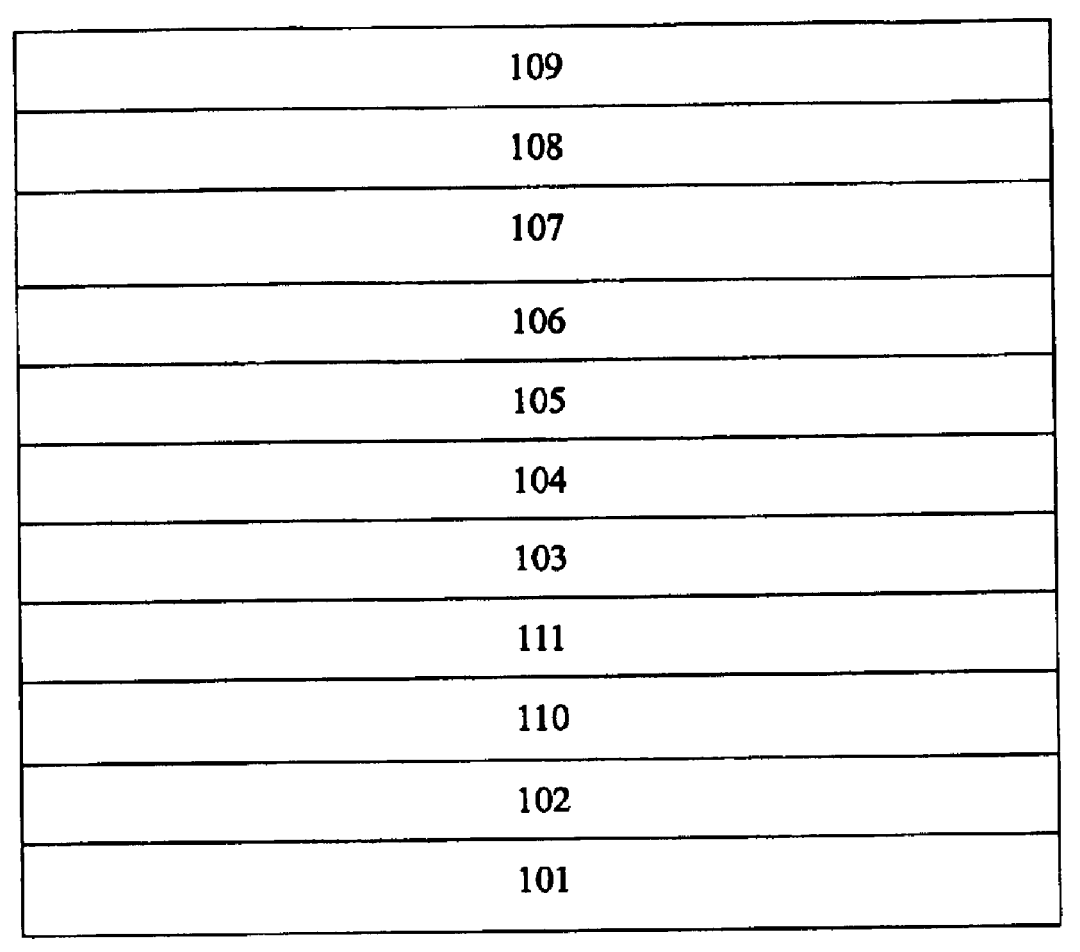

FIG. 2 shows the pseudomorphic High Electron Mobility Transistor according to the second better practical implementation example of this invention. Its structure is similar to that of the pHEMT according to the first better practical implementation example shown in FIG. 1. The same parts appeared in the first and second better practical implementations are assigned the same number, and we don't describe them any more. As shown in FIG. 2, the structure of the pHEMT according to the second better practical implementation example further contains one additional δ-doped carrier supplying layer 110 over the non-doped buffer layer 102, and one additional non-doped spacer layer 111 over the additional δ-doped carrier supplying layer 110.

In order to understand and implement this invention more easily, please refer to the description of the following implementation examples.

EXAMPLE 1

In this example, one InGaP/InGaAs/GaAs single δ-doped pHEMT device is proposed. As shown in FIG. 3, from bottom to up, its structure consists of one semi-insulating GaAs substrate on the basis, one 0.2 μm non-doped GaAs buffer layer over one semi-insulating GaAs substrate, one 100 Å non-doped In$_{0.15}$Ga$_{0.85}$As strain layer, one 30 Å non-doped In$_{0.49}$Ga$_{0.51}$P first spacer layer, one δ-doped carrier supplying layer with concentration of δ(n)=2.5×10$^{12}$ cm$^{-3}$, one 30 Å non-doped In$_{0.49}$Ga$_{0.51}$P second spacer layer, one 500 Å n-doped In$_{0.49}$Ga$_{0.51}$P layer with concentration of n=1×10$^{17}$ cm$^{-3}$, one 100 Å p$^+$-doped In$_{0.49}$Ga$_{0.51}$P layer with concentration of p$^+$=8×10$^{18}$ cm$^{-3}$, and one 200 Å n$^+$-doped GaAs covering layer with concentration of n$^+$=6×10$^{18}$ cm$^{-3}$. The metal Au of the gate electrode constitutes the ohmic contact over the covering layer. The metal AuGeNi of the drain electrode and source electrode lying beside the metal Au of the gate electrode respectively both constitute the ohmic contact over the covering layer. Some section of the covering layer is etched.

Figure 4:
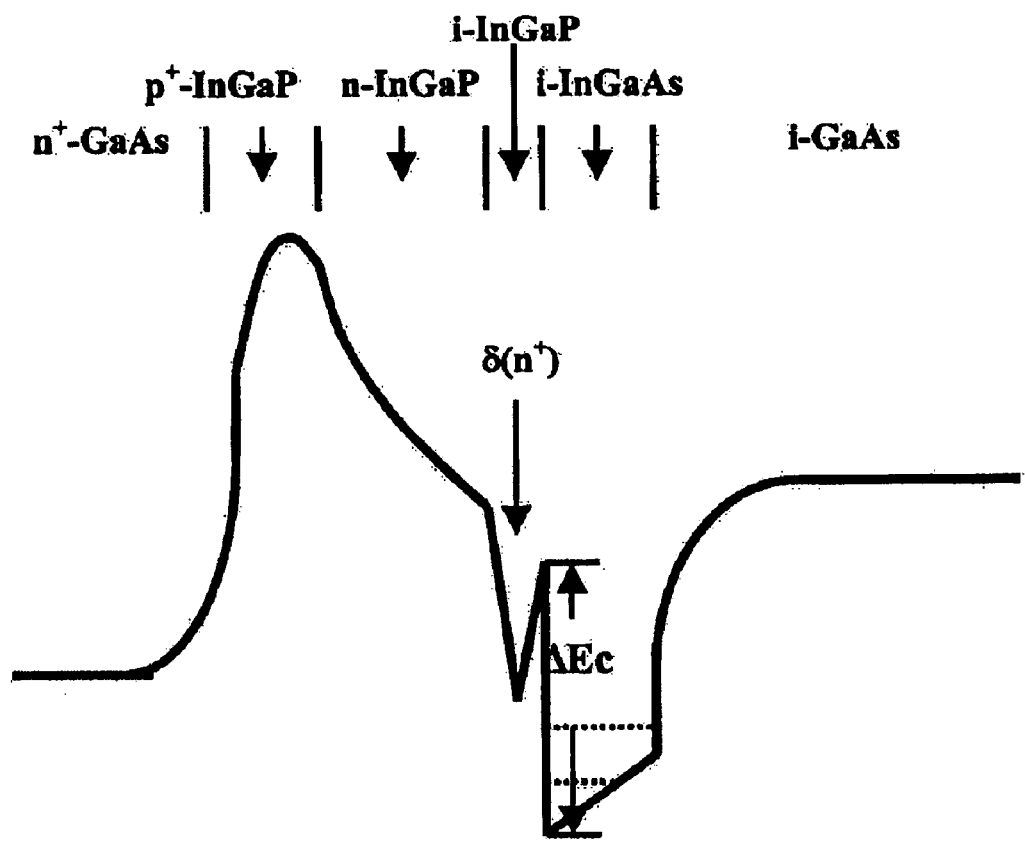
FIG. 4 shows the corresponding energy-band plot of the conduction band of the pHEMT prepared in Example 1 of the present invention.
Figure 5:
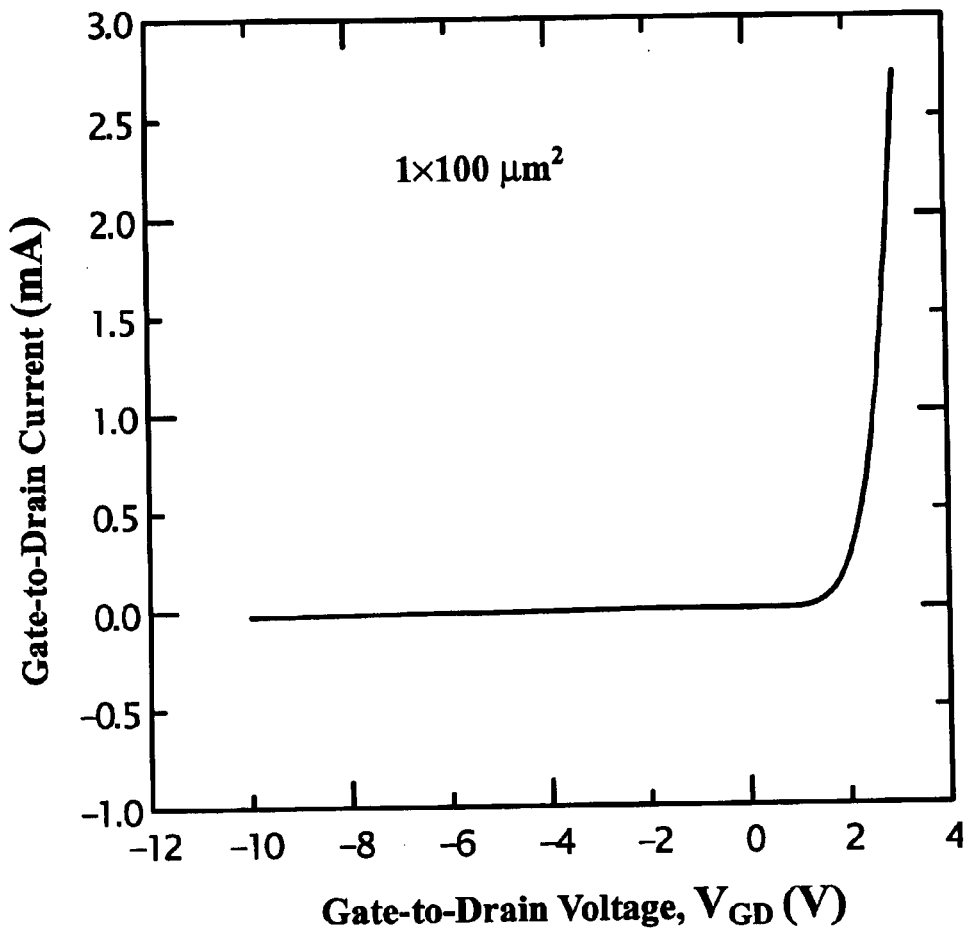
FIG. 5 shows the two-terminal gate-drain current-voltage output characteristic curve of the device prepared in Example 1 of the present invention.
Figure 6:
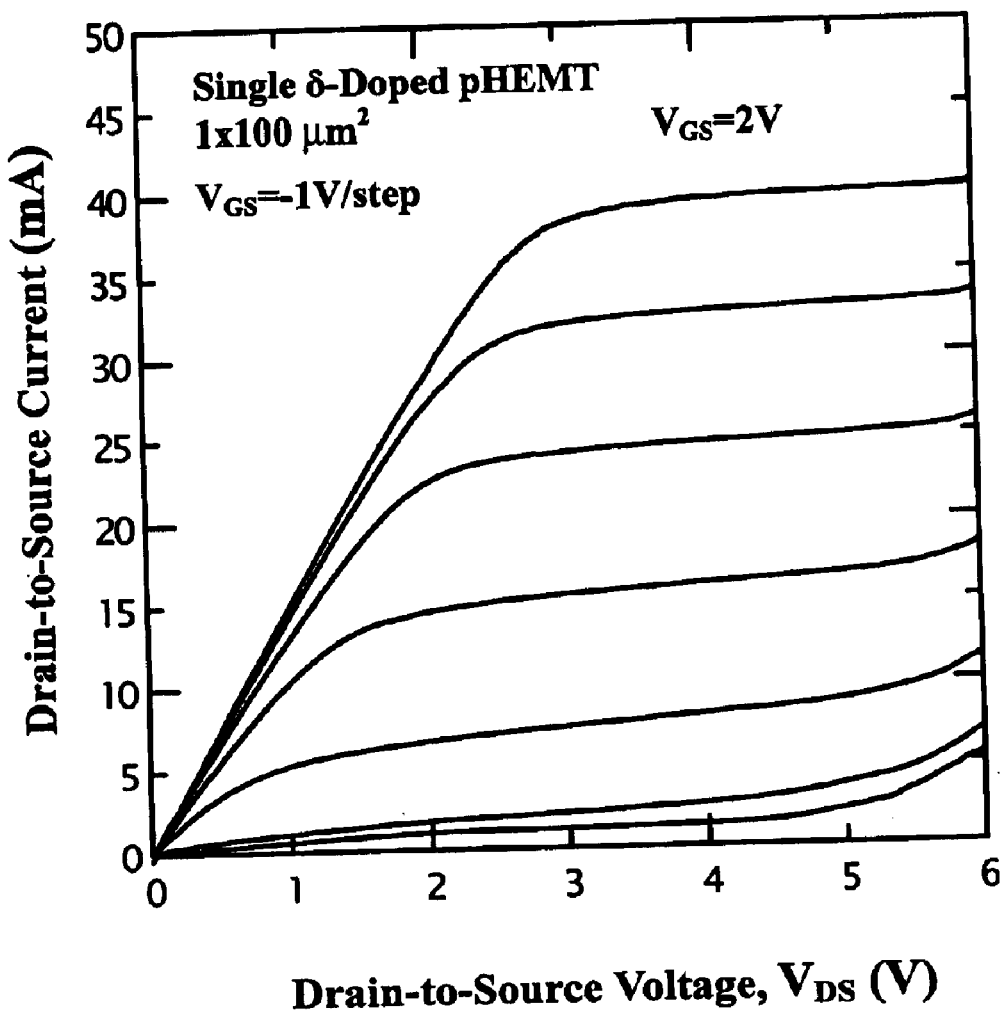
FIG. 6 shows the three-terminal common-source current-voltage output characteristic curve of the device prepared in Example 1 of the present invention.
Figure 7:
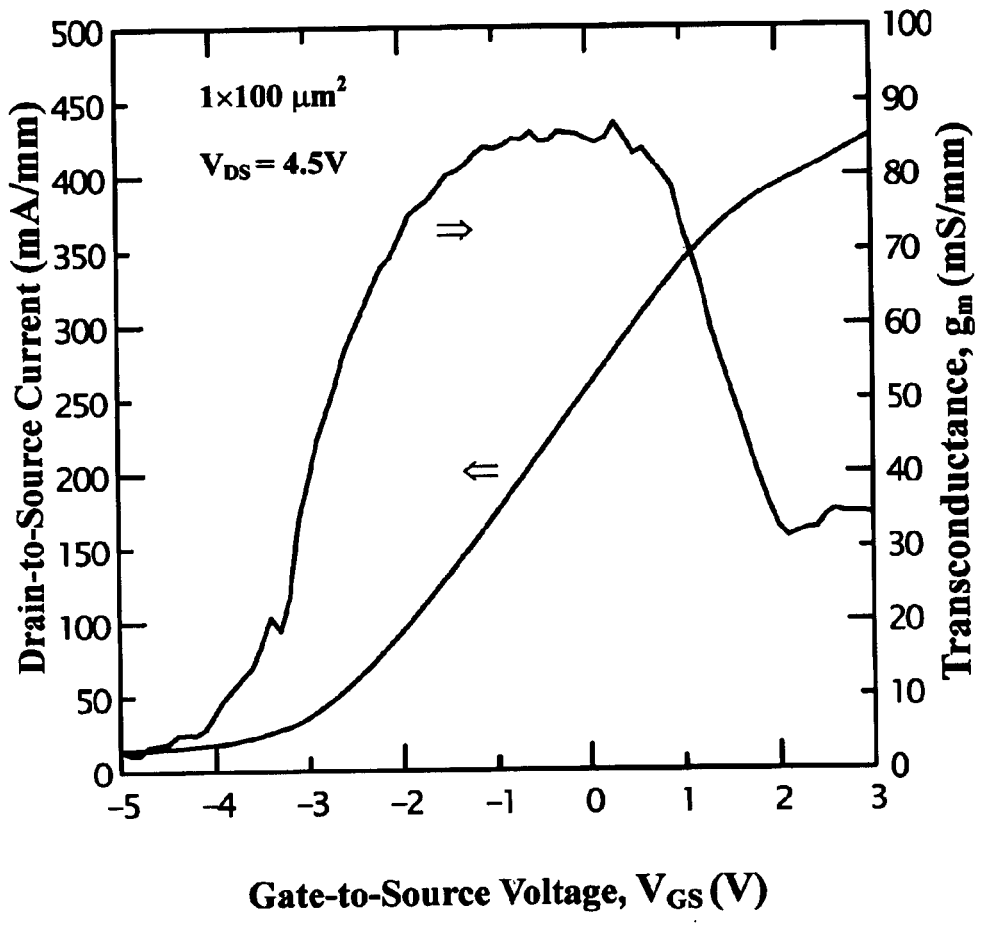
FIG. 7 shows the relationship of the drain saturation current and transconductance versus the gate voltage of the device prepared in Example 1 of the present invention.
Figure 8:
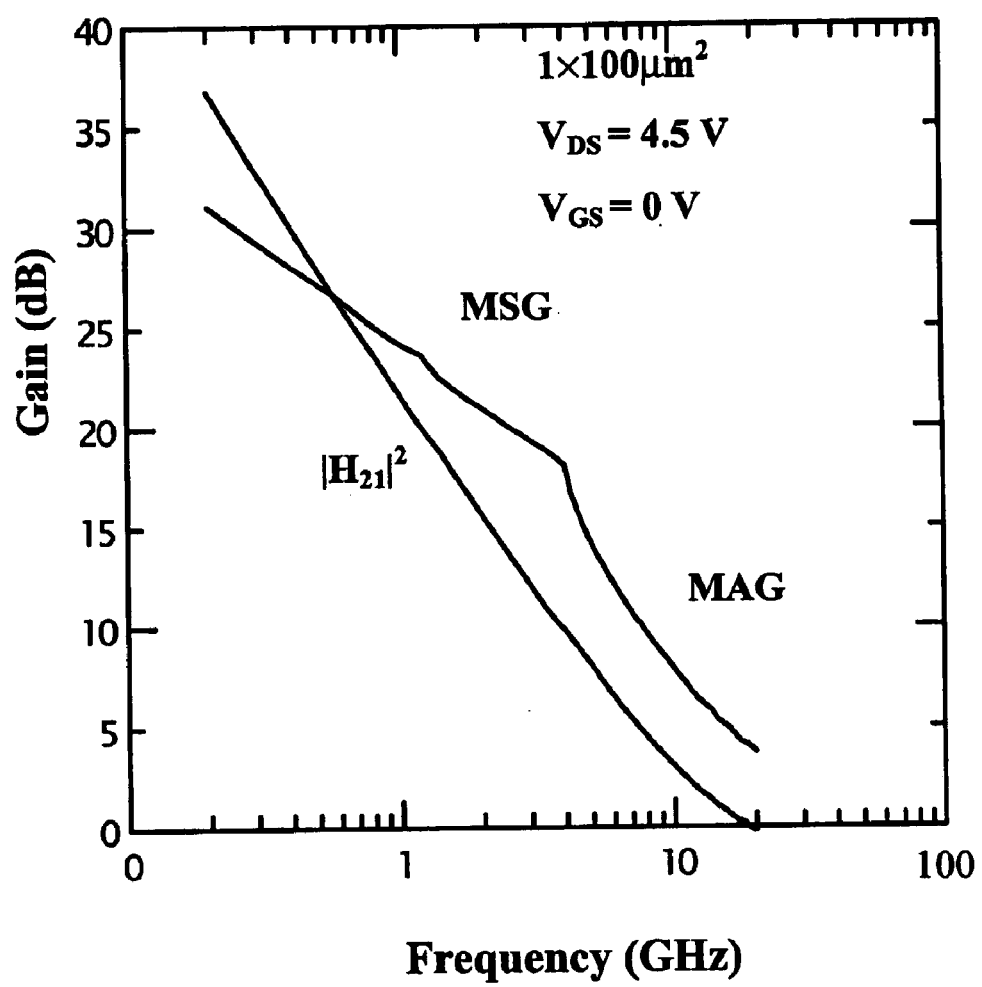
FIG. 8 shows the high-frequency characteristics of the device prepared in Example 1 of the present invention.

The structure of the gate is made up of n$^+$-GaAs/p$^+$-InGaP/n-InGaP. Because the p$^+$-InGaP layer is so thin that it is completely depleted by n$^+$-GaAs and n-InGaP. The energy-band plot of the conduction band is shown as FIG. 4. In this structure, one δ(n$^+$) is inserted between two layers of large energy-gap i-InGaP spacer for constructing the carrier supplying layer of InGaAs strain layer of pHEMT. Also, one 2DEG is produced in InGaAs. When the gate is positively biased, n$^+$-GaAs/p$^+$-InGaP camel-gate is reverse-biased, and p$^+$-InGaP/channel region is forward-biased. Due to the existence of the 0.32 eV conduction band discontinuity (ΔEc) at the InGaP/InGaAs heterojunction and the contribution of p-n depletion between p$^+$-InGaP gate and channel region, the confinement effect for electron in the InGaAs channel is excellent and the potential barrier of the gate of the proposed pHEMT is higher than that (about 0.5–0.6 eV) of conventional MESFET. The two-terminal experimental gate-drain current-voltage output characteristic curve is plotted as FIG. 5. Specifically, the turn-on voltage can reach up to 1.7 V, and the gate-drain breakdown voltage is over 10 V. Because InGaP is large energy-gap material, its breakdown electric field is so high as to achieve extremely large gate-drain breakdown voltage. The three-terminal experimental current-voltage output characteristic of typical InGaP/InGaAs/GaAs n-channel single δ-doped pHEMT device is illustrated as FIG. 6. Because the turn-on voltage of the gate-drain junction is so high that the V$_{GS}$ can go up to +2 V, the operating range of V$_{GS}$ at positive bias is enlarged and the drain current is increased. When V$_{GS}$=0, the saturation voltage of V$_{DS}$ is about 2.2 V. Besides, the threshold voltage can be down to −4.5 V. When the gate is negatively biased, n$^+$-GaAs/p$^+$-InGaP camel-gate is forward-biased, and p$^+$-InGaP/channel region is reverse-biased. The depletion region will extend into InGaAs layer, while most of 2DEG carriers in InGaAs strain layer will be modulated and the concentration thereof will increase. Besides, the applied negative gate bias partly lies on the high-doped n$^+$-GaAs/p$^+$-InGaP camel-gate, the total thickness of the depletion region changes rarely. So typical InGaP/InGaAs/GaAs n-channel single δ-doped pHEMT device can achieve high drain current and high linearity of transconductance simultaneously, and improve the poor linearity of transconductance in conventional HEMT. FIG. 7 shows the relationship of the output saturation current and transconductance of the proposed device versus the gate voltage. If the $V_{DS}$ is given by +4.5 V, when $V_{GS}$=0 and +2 V, the output saturation current is 270 and 425 mA/mm, respectively, and the maximum transconductance $g_{m(ext)}$ is 85 mS/mm. Besides, when $V_{GS}$ ranges from −2 V to +1 V, the transconductance can reach over 80% of the maximum transconductance. The device has a broad operating range of $V_{GS}$, so the device is beneficial for circuit application. The microwave characteristics of the device are illustrated as FIG. 8, where $f_t$ and $f_{max}$ are 18 GHz and 30 GHz, respectively.

EXAMPLE 2

Figure 9:
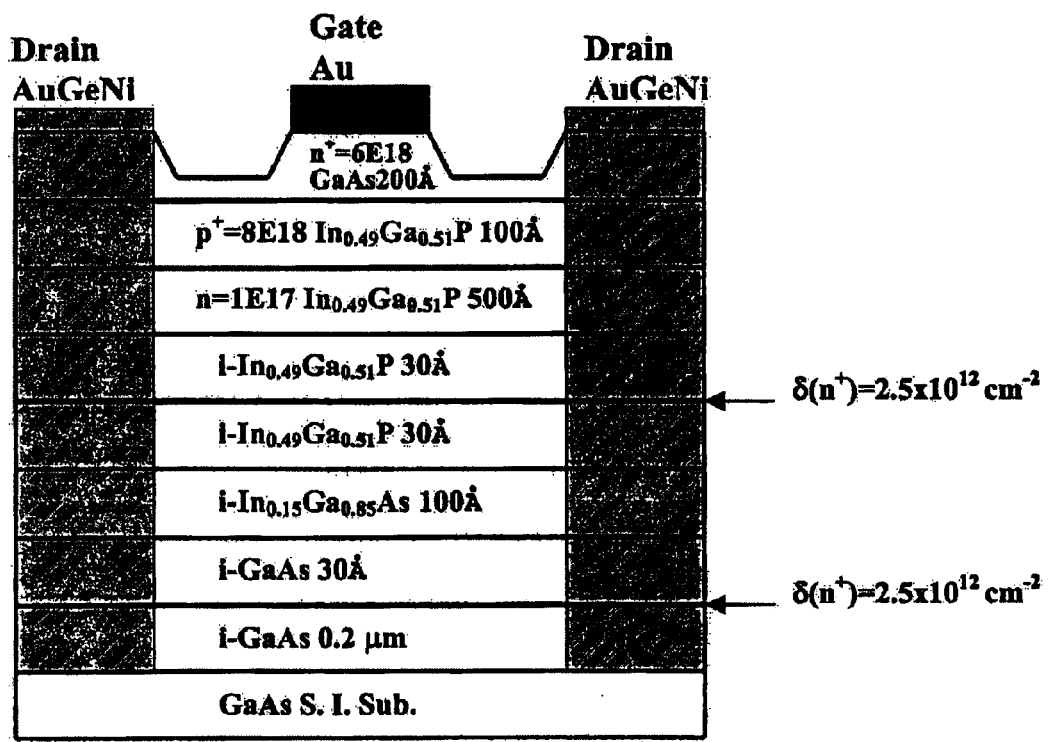
FIG. 9 shows the structure of pHEMT prepared in Example 2 of the present invention.
Figure 10:
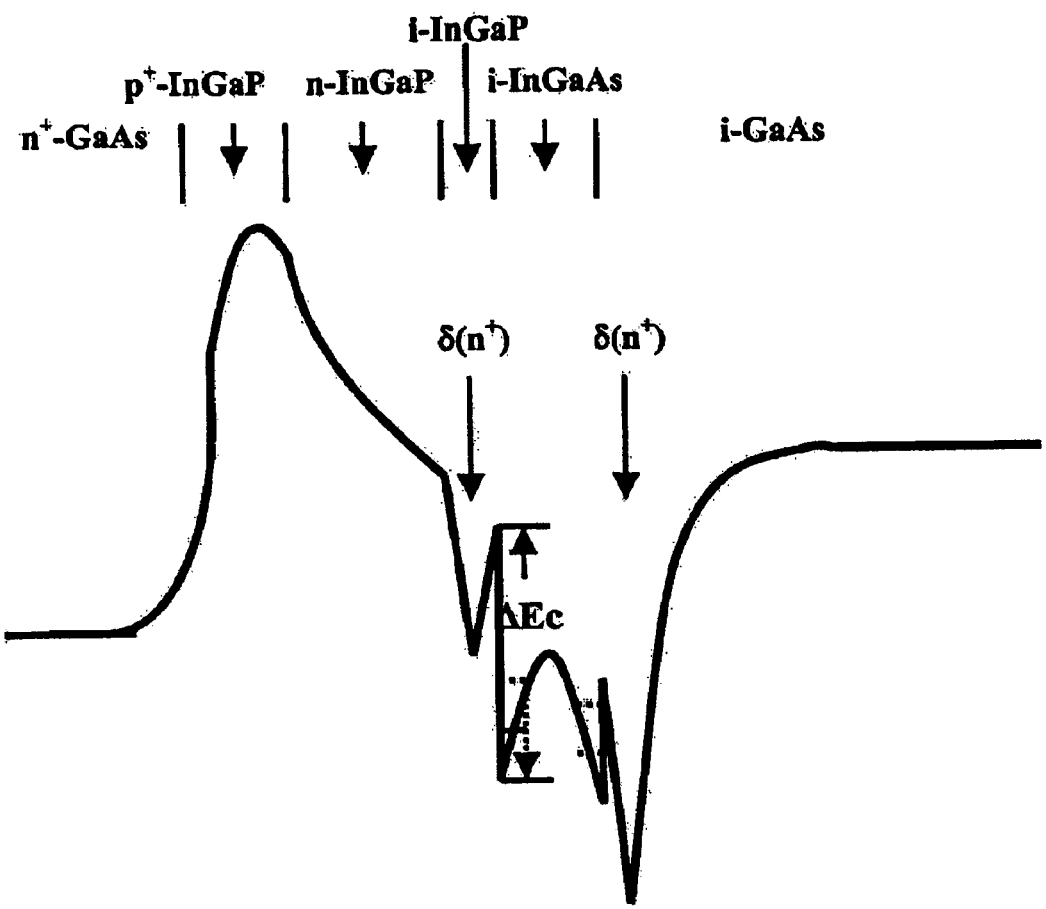
FIG. 10 shows the corresponding energy-band plot of the conduction band of the pHEMT prepared in Example 2 of the present invention.
Figure 11:
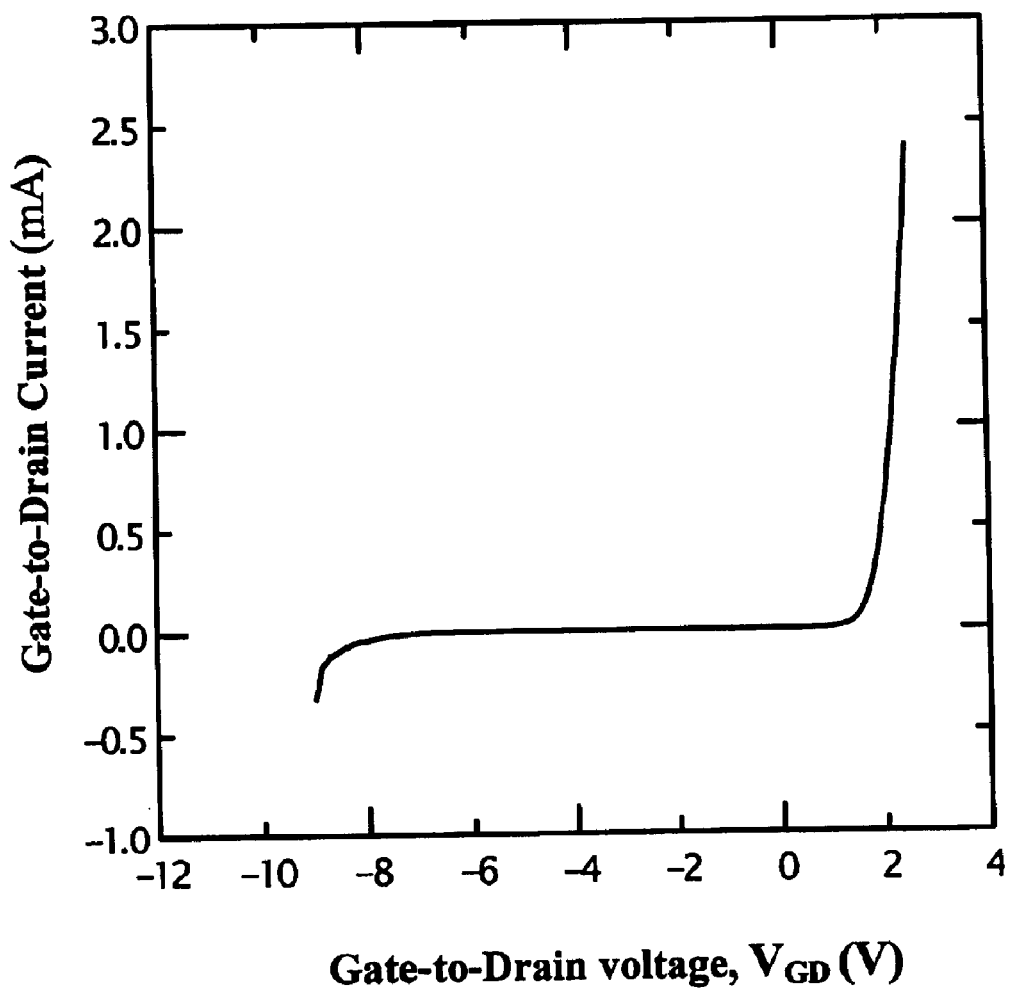
FIG. 11 shows the two-terminal gate-to-drain current-voltage output characteristic of the device prepared in Example 2 of the present invention.

As shown in FIG. 9, this example presents InGaP/InGaAs/GaAs double δ-doped pHEMT device, whose structure is similar to Example 1. In the structure of this example, another carrier supplying layer, δ(n⁺), and another i-GaAs lay as an additional non-doped spacer layer are formed between the non-doped spacer layer, i-GaAs, and the InGaAs strain layer. The energy-band plot of the conduction band of the device is illustrated as FIG. 10. There are two 2DEG forming in the InGaAs strain layer. Because the structure is double δ(n⁺)-doped, the concentration of the channel is so high that the threshold voltage will also increase. The two-terminal current-voltage output characteristic of double δ-doped pHEMT is shown as FIG. 11. The gate-drain breakdown voltage is over 8 V, and the forward turn-on voltage is 1.7 V. Compared with single δ-doped pHEMT device, the forward turn-on voltage of double δ-doped pHEMT device is almost identical to that of single δ-doped pHEMT device because of the same gate structure, except the gate-drain breakdown voltage of double δ-doped pHEMT device is lower than that of the device in Example 1. This is because double δ(n⁺) doping sheets causes the channel concentration so higher that the confinement effect for the carriers in the InGaAs channel is not so good.

Figure 12:
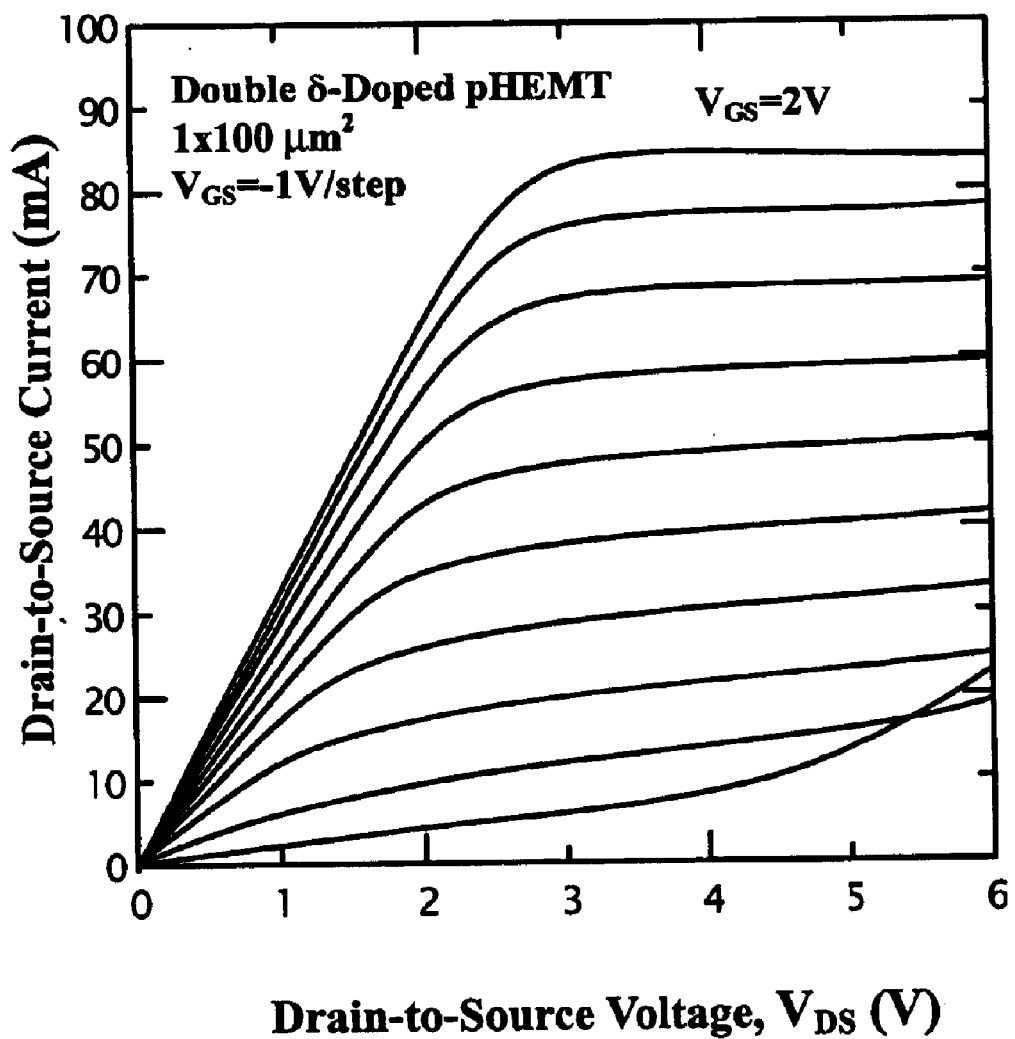
FIG. 12 shows the three-terminal common-source current-voltage output characteristic of the device prepared in Example 2 of the present invention.

The three-terminal experimental current-voltage output characteristic of typical double δ-doped pHEMT is shown as FIG. 12. When $V_{GS}$=0, the saturation voltage of $V_{DS}$ is about 2.6 V. Besides, the threshold voltage can go up to −7 V, and the maximum output current can reach 850 mA/mm. When the gate is positively biased, the depletion will shrink into the upper δ(n⁺) carrier supplying layer. It makes most of carriers in the upper 2DEG modulate and increase, so the higher drain current can be achieved. When the negative gate voltage is high enough, the upper 2DEG and i-InGaAs layer will deplete. Meanwhile, even only one triangular well at the bottom will occur. Most of carriers on the triangular well at the bottom will continue to increase and modulate until the triangular well is depleted completely. Therefore, the threshold voltage is also increased further. In addition, because the applied negative gate voltage partly lies on the highly-doped n⁺-GaAs/p⁺-InGaP camel-gate, the total thickness of the depletion region changes rarely. So the presented pHEMT device can achieve both characteristics of high drain current and excellent linearity of transconductance.

Figure 13:
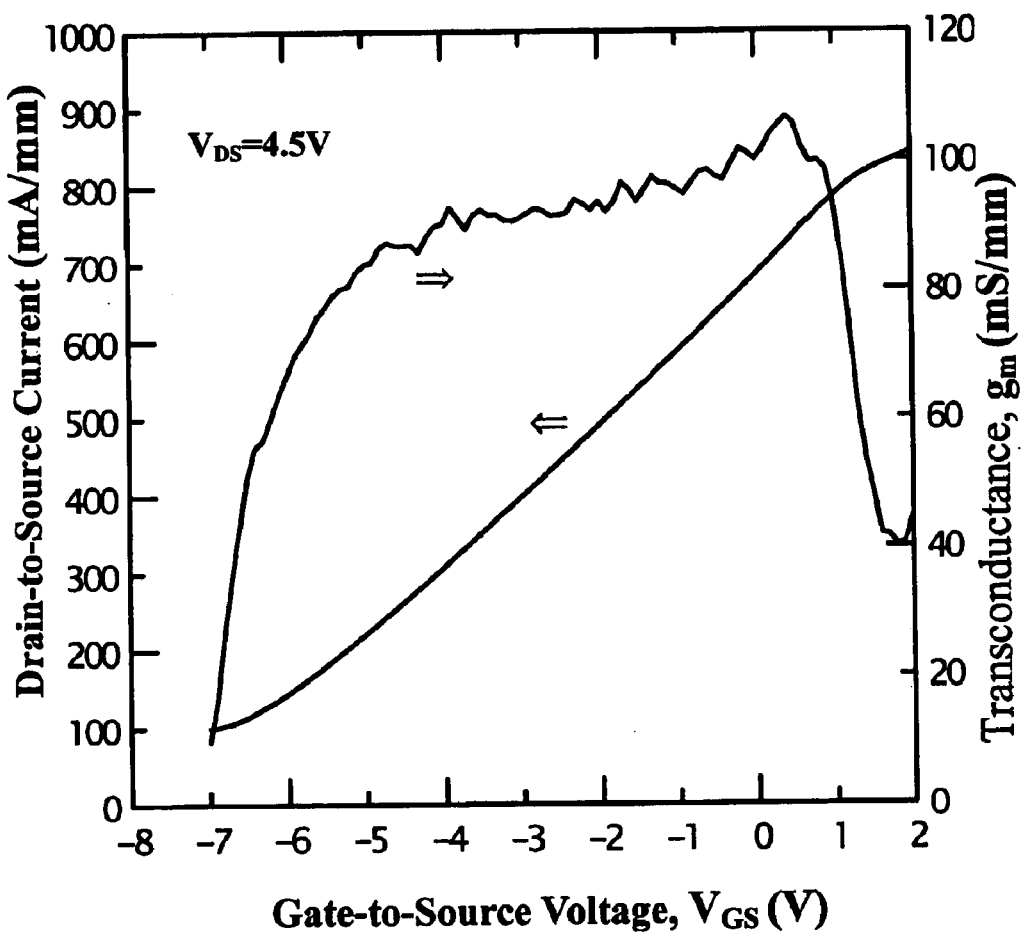
FIG. 13 shows the relationship of the drain saturation current and transconductance versus the gate voltage of the device prepared in Example 2 of the present invention.
Figure 14:
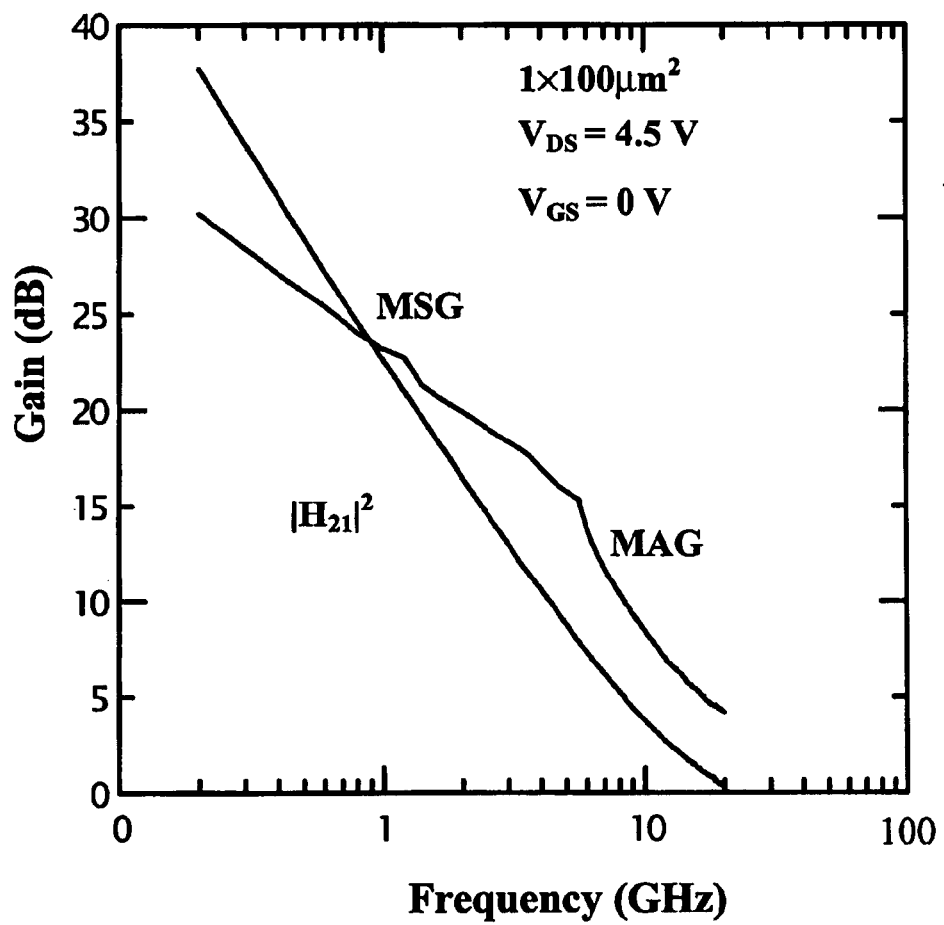
FIG. 14 shows the high-frequency characteristics of the device prepared in Example 2 of the present invention.

FIG. 13 illustrates the relationship of the output saturation current and transconductance versus the gate voltage in the presented pHEMT device. If $V_{DS}$ is given by +4.5 V, when $V_{GS}$=0 and +2 V, the output saturation current is 680 and 810 mA/mm, respectively, and the maximum transconductance $g_{m(ext)}$ is 107 mS/mm. Besides, when $V_{GS}$ ranges from −5 V to +1 V, the transconductance can reach over 80% of the maximum transconductance. The device has a broad operating range of $V_{GS}$, so the device is beneficial for circuit application. The microwave characteristics of the device are shown as FIG. 14, where $f_t$ and $f_{max}$ are 20 GHz and 32 GHz, respectively.

In the linearity analysis of Example 1 and 2 above, the relationship of $I_{DS}$ and $V_{gs}$ can be represented by the following sixth-order polynomial equation:

$$I_{ds}=b_0+b_1V_{gs}^2+b_3V_{gs}^3+b_4V_{gs}^4+b_5V_{gs}^5+b_6V_{gs}^6$$

Table 1 shows the relationship of the linearity $b_n$ in Example 1 and 2; respectively. From the table, we can find that the harmonic distortion of both Example 1 and 2 are really small, so the linearity of both them is extremely high. Therefore, the devices presented in the invention are very suitable for linear, large signal and microwave high-frequency circuit application.

Although the present invention has been described with reference to specific details of certain embodiments thereof, it is not intended that such details should be regarded as limitations upon the scope of the invention except as and to the extent that they are included in the accompanying claims. Many modifications and variations are possible in light of the above disclosure.

What is claimed is:

1. A structure of pseudomorphic High Electron Mobility Transistor (pHEMT), which comprising a semiconductor substrate;

a buffer layer an said semiconductor substrate;

a non-doped strain layer on said buffer layer;

a first non-doped spacer layer on said non-doped strain layer;

a δ-doped carrier supplying layer on said first non-doped spacer layer;

a second non-doped spacer layer on said δ-doped carrier supplying layer;

an n-doped semiconductor layer on said second non-doped spacer layer;

a p⁺-doped semiconductor layer on said n-doped semiconductor layer; and an n⁺-doped semiconductor covering layer over the aforementioned p⁺-doped semiconductor layer; wherein the structure of the presented pHEMT, the first non-doped spacer layer, the second non-doped spacer layer, the n-doped semiconductor layer, and the p⁺-doped semiconductor layer are made of the same material.

2. The structure as defined in claim 1 further comprising an additional δ-doped carrier supplying layer on said buffer layer; an additional non-doped spacer layer on said additional δ-doped carrier supplying layer; therefore, said non-doped strain layer is on said additional non-doped spacer layer.

3. The structure as defined in claim 1 or 2, wherein said semiconductor substrate is a semi-insulating GaAs.

4. The structure as defined in claim 1 or 2, wherein said buffer layer inside is a non-doped GaAs.

5. The structure as defined in claim 1 or 2, wherein said non-doped strain layer is a $In_xGa_{1-x}As$, wherein x is 0.05~0.25, and has a thickness ranging from 50 Å to 200 Å.

6. The structure as defined in claim 1 or 2, wherein said first non-doped spacer layer and said second non-doped spacer layer are $In_{0.49}Ga_{0.51}P$, and have a thickness ranging from 25 Å to 100 Å.

7. The structure as defined in claim 1 or 2, wherein said first non-doped spacer layer and said second non-doped spacer layer are $Al_xGa_{1-x}As$, wherein x is 0.2~0.5, and have a thickness ranging from 25 Å to 100 Å.

8. The structure as defined in claim 1 or 2, wherein said δ-doped carrier supplying has a concentration of $\delta(n)=1\times 10^{12}\sim 1\times 10^{13}$ cm$^{-3}$.

9. The structure as defined in claim 2, wherein said additional δ-doped carrier supplying layer has a concentration of $\delta(n)=1\times 10^{12}\sim 1\times 10^{13}$ cm$^{-3}$.

10. The structure as defined in claim 2, wherein said additional non-doped spacer layer is GaAs, and has a thickness ranging from 25 Å to 100 Å.

11. The structure as defined in claim 1 or 2, wherein said n-doped semiconductor layer is In$_{0.49}$Ga$_{0.51}$P, and has a thickness ranging from 200 Å to 1000 Å and a concentration of $n=5\times 10^{16}\sim 5\times 10^{17}$ cm$^{-3}$.

12. The structure as defined in claim 1 or 2, wherein said n-doped semiconductor layer is Al$_x$Ga$_{1-x}$As, wherein x is 0.2~0.5, and has a thickness ranging from 200Å to 1000 Å and a concentration of $n=5\times 10^{16}\sim 5\times 10^{17}$ cm$^{-3}$.

13. The structure as defined in claim 1 or 2, wherein sad p$^+$-doped semiconductor layer is In$_{0.49}$Ga$_{0.51}$P, and has a thickness ranging from 80 Å to 200 Å and a concentration of $p^+=1\times 10^{18}\sim 4\times 10^{19}$ cm$^{-3}$.

14. The structure as defined in claim 1 or 2, wherein said p$^+$-doped semiconductor layer is Al$_x$Ga$_{1-x}$As, wherein x is 0.2~0.5, and has a thickness ranging from 80 Å to 200Å and a concentration of $p^+=1\times 10^{18}\sim 4\times 10^{19}$ cm$^{-3}$.

15. The structure as defined in claim 1 or 2, wherein said n$^+$-doped semiconductor covering layer is GaAs, and has a thickness ranging from 150 Å to 400 Å and a concentration of $n^+=1\times 10^{18}\sim 4\times 10^{19}$ cm$^{-3}$.

* * * * *